(12) United States Patent
Markovic et al.

(10) Patent No.: US 6,642,765 B2
(45) Date of Patent: Nov. 4, 2003

(54) TRANSMISSION-GATE BASED FLIP-FLOP

(75) Inventors: Dejan Markovic, Berkeley, CA (US); James W. Tschanz, Hillsboro, OR (US); Vivek K. De, Beaverton, OR (US)

(73) Assignee: Intel Corporation, DE (US)

( * ) Notice: Subject to any disclaimer, the term of this patent is extended or adjusted under 35 U.S.C. 154(b) by 0 days.

(21) Appl. No.: 10/010,046

(22) Filed: Dec. 6, 2001

(65) Prior Publication Data

US 2003/0107421 A1 Jun. 12, 2003

(51) Int. Cl.[7] ............................................. H03K 3/356
(52) U.S. Cl. ..................... 327/211; 327/202; 327/206
(58) Field of Search ................................. 327/200, 201, 327/202, 203, 207, 208, 210, 211, 212

(56) References Cited

U.S. PATENT DOCUMENTS

| | | | | |
|---|---|---|---|---|
| 5,250,852 A | * | 10/1993 | Ovens et al. | 327/202 |
| 5,854,565 A | * | 12/1998 | Jha et al. | 327/202 |
| 6,198,324 B1 | * | 3/2001 | Schober | 327/202 |
| 6,211,713 B1 | * | 4/2001 | Uhlmann | 327/211 |

OTHER PUBLICATIONS

Suzuki, K. Odagawa, and T. Abe, Clocked CMOS Calculator Circuitry, IEEE Journal of Solid State Circuits, vol. DC–8, pp. 462–469, Dec. 1973.

G. Gerosa et al., "2.2W 80 MHz superscalar RISC Processor," IEEE Journal of Solid–State Circuits, vol. 34, No. 12, pp. 247–254, Dec. 1994.

S. Hsu and S–L. Lu, A Novel High–Performance Low–Power CMOS Master–Slave Flip–Flop, In Proc. Twelfth Annual IEEE ASIC/SOC Conf. 1999, pp. 340–343.

H. Takahashi, "Low–Power and High Performance Circuit Design of General Purpose DSPs," in Proc. VLSI Circuits Short Course 20001 (at VLSI Symp. 2001), p. 87.

* cited by examiner

Primary Examiner—Timothy P. Callahan
Assistant Examiner—An T. Lu
(74) Attorney, Agent, or Firm—Fish & Richardson P.C.

(57) ABSTRACT

Flip-flop circuitry having an input configured to receive an input signal and an output configured to deliver an output signal corresponding to the input signal; a clock terminal configured to provide timing signals for reception of the input signal at the input and transmission of the output signal at the output; two on-path inverters connected serially between the input and output, and configured not to respond to the timing signals; and two feedback inverters respectively connected in parallel with the two on-path inverters, the first and second feedback inverters being configured to respond to the timing signals.

26 Claims, 3 Drawing Sheets

TRANSMISSION-GATE BASED FLIP-FLOP

BACKGROUND

This invention relates to flip-flops.

Flip-flops are used in VLSI systems to keep signals correlated in time. Modern microprocessors use a large array of flip-flops that are chosen to suit speed and output load requirements. Most microprocessor signal paths are non-critical, and surplus timing use for energy reduction is possible for logic blocks and flip-flops in these paths. As the number of logic gates which lie between signal path flip-flops decrease, the relative impact of the timing delay and energy consumption in the logic gates is reduced, and the relative impact of the timing delay and energy consumption of the flip-flops increases as does the benefit of using low-energy flip-flop designs.

One type of low-energy flip-flop is the master-slave latch pair. As shown in FIG. 1, one such low-energy master-slave latch pair flip-flop is a transmission-gate based flip-flop (TGFF) 10 where n-MOS-only clocked transistors 20, 30 are used to reduce energy consumption. However, on-path inverters 40, 50, which are interrupted by clock signals "CP" and "CN" 60, 70, respectively, slow down the flip-flop and increase the energy consumed. Also, inverter 90 places a logic level 1 at $\overline{Q_M}$ 100 when input 80 is at logic level 0 and clock signal "CN" 70 is activated with a logic level 1. However feedback inverter 110 cannot invert the logic level 1 at $\overline{Q_M}$ 100 due to a logic level 0 at clock signal "CP" 60 that disables inverter 110. Therefore inverter 90 is unnecessarily consuming energy by "pulling-up" the voltage level at $\overline{Q_M}$ 100.

In another known flip-flop architecture 130, shown in FIG. 2, pull-up transistors of inverters 90, 120 of FIG. 1 are removed, leaving NMOS transistors, to save energy. However, non-interrupted feedback inverters 140, 150 cause excessive short-circuit energy consumption and a longer time delay arising from a contention with the transmission-gates 160, 170. Inverter 180 is not necessary because the input of the inverter 140 can be connected to $\overline{Q_M}$ 190.

DESCRIPTION

Figure 1:
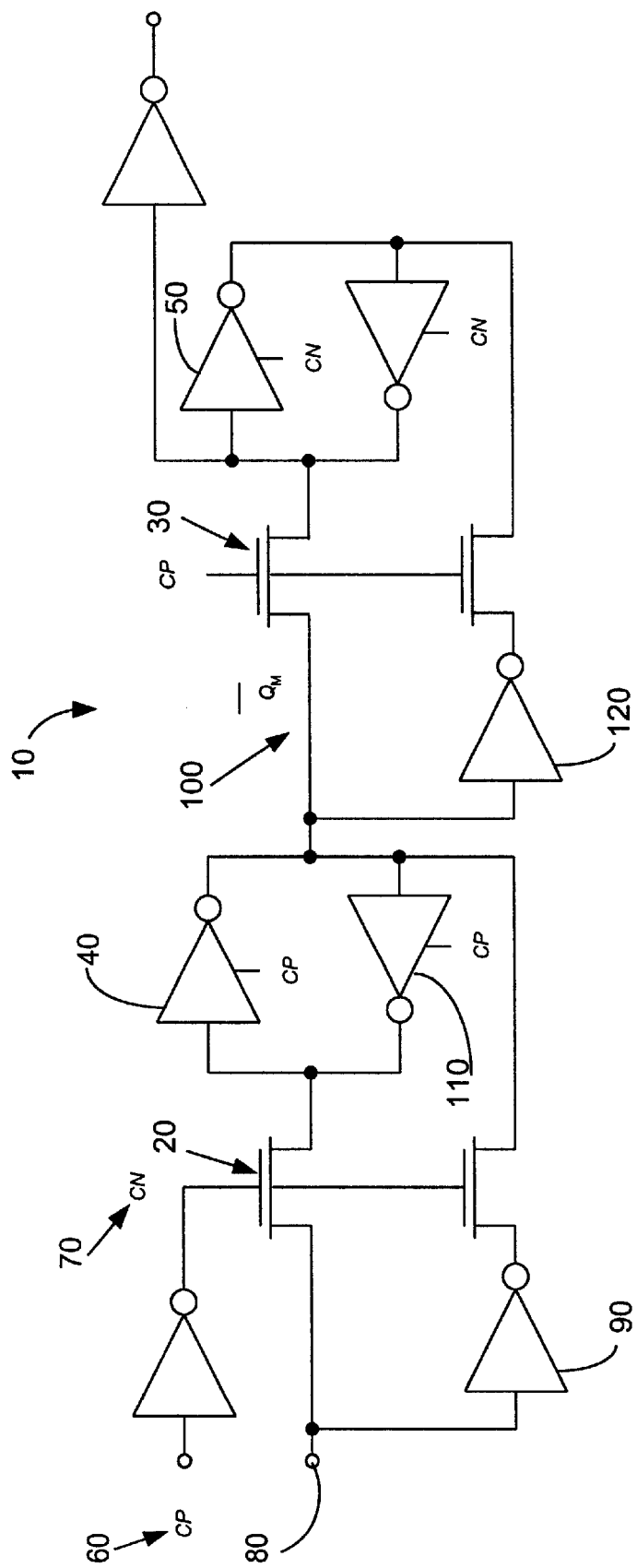
FIG. 1 shows a flip-flop with clock interrupted on-path and feedback transistors.
Figure 2:
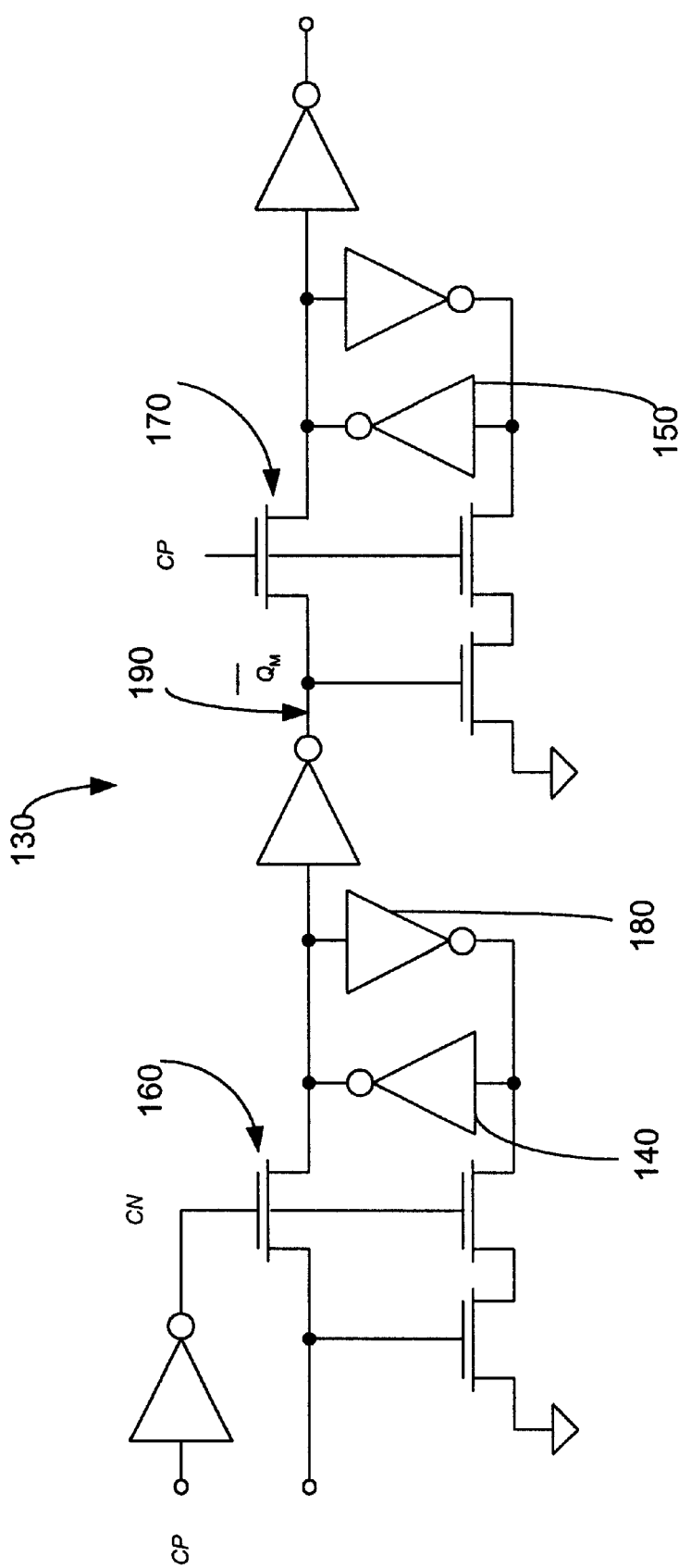
FIG. 2 shows a flip-flop with non-clock interrupted on-path and feedback transistors.
Figure 3:
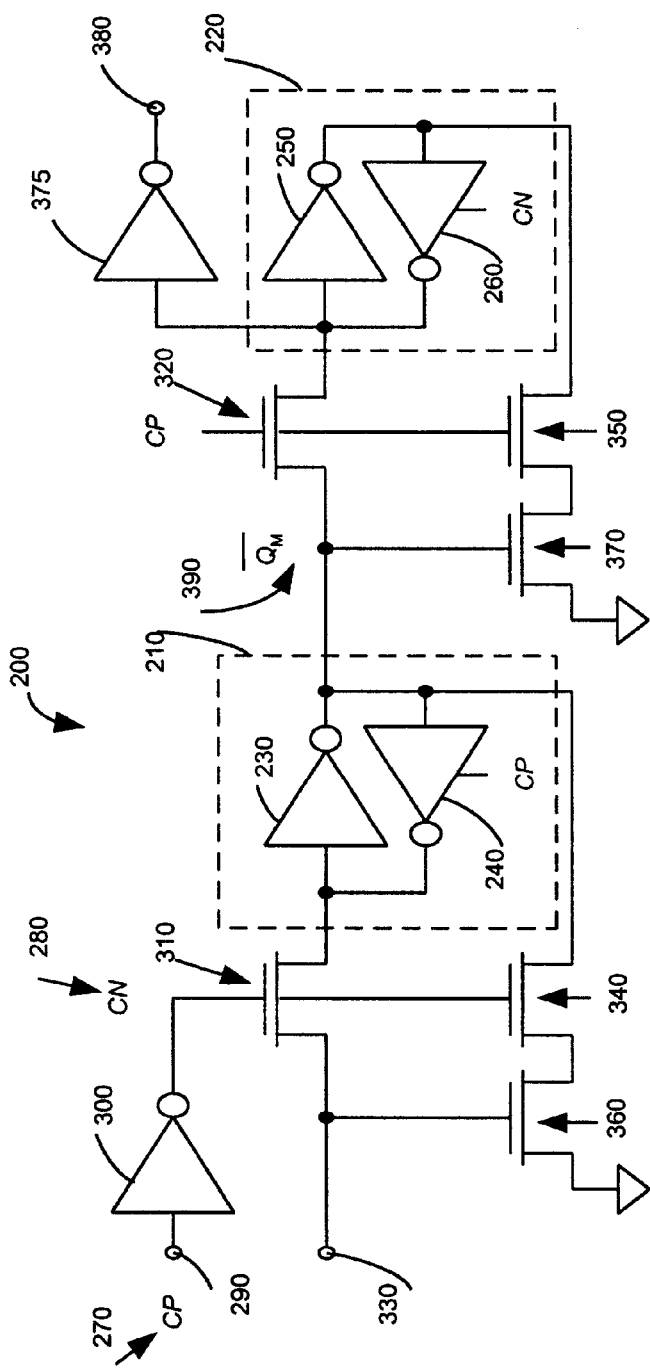
FIG. 3 shows a flip-flop with only clock interrupted feedback transistors.

FIG. 3 shows a flip-flop 200 that includes two pairs 210, 220 of parallel connected inverters 230, 240, 250, 260 in which a feedback inverter 240 receives a clock signal "CP" 270 and a feedback inverter 260 receives a clock signal "CN" 280 and on-path inverters 230, 250 do not receive a clock signal. By providing a clock signal only to particular inverters of the two pairs 210, 220, the flip-flop 200 operation speed is increased while energy consumption is decreased. By removing the clock signal from the on-path inverters 230, 250 timing interruptions are removed that would otherwise slow down the flip-flop 200. Also by removing the clock signal from the on-path inverters 230, 250, the energy consumption required for the flip-flop 200 to operate is reduced.

Each feedback inverter 240, 260 receives the clock signal "CP" 270 which is received at clock terminal 290 from an external clock (not shown) or the clock signal "CN" 280 which is the clock signal "CP" 270 inverted through inverter 300. Transmission-gate transistors 310, 320 provide very low energy consumption and relatively short delay. The transmission-gate transistor 310 is serially connected to flip-flop input 330 and the transmission-gate transistor 320 is connected between the two pairs 210, 220 of parallel connected inverters. Small n-MOS transistors 340, 350 are placed in parallel with each of the transmission-gate transistors 310, 320 to compensate for a voltage drop when a logic level 1 is propagated through the transmission-gate transistors 310, 320. Transistors 360, 370, rather than inverters, are serially connected with each small n-MOS transistor 340, 350 to further reduce energy consumption by not pulling-up voltage levels of the flip-flop 200. The master latch includes the first pair of parallel-connected inverters 210, the transmission-gate transistor 310, the small n-MOS transistor 340, and the transistor 360. The slave latch includes the second pair of parallel-connected inverters 220, the transmission-gate transistor 320, the small n-MOS transistor 350, the transistor 370, and an output inverter 375. When a logic level 0 is present on the clock signal "CP" 270, the logic level on the input 330 is transferred to the master latch and inverter 300 disables the slave latch. The slave latch is enabled and the master latch disabled when a logic level 0 is present on the clock signal "CN" 280. Once enabled the logic level of the output 380 will be the inverted logic level of the stored logic level present at $\overline{Q_M}$ 390.

Other embodiments are within the scope of the following claims. For example, the flip-flop circuitry is usable in a pulse-triggered latch flip-flop or in a cycle latch flip-flop. The circuitry is also usable in pass-transistor logic.

What is claimed is:

1. An apparatus comprising:
   flip-flop circuitry including;
   an input configured to receive an input signal and an output configured to deliver an output signal corresponding to the input signal,
   a clock terminal configured to provide a timing signal for reception of the input signal at the input and transmission of the output signal at the output,
   two on-path inverters connected serially between the input and output, the two on-path inverters being configured not to respond to the timing signal,
   two feedback inverters respectively connected in parallel with the two on-path inverters, the first and second feedback inverters being configured to respond to the timing signal,
   two transmission gate transistors respectively connected serially between the input and the first on-path inverter and between the first on-path inverter and the second on-path inverter, and
   a pair of additional transistors connected in parallel with one of the transmission gate transistors.

2. The apparatus of claim 1 wherein the second feedback inverter is configured to respond to an inverted version of the timing signal to which the first feedback inverter is configured to respond.

3. The apparatus of claim 1 also including transistors.

4. The apparatus of claim 1 also including MOSFETs.

5. The apparatus of claim 1 wherein the transmission gate transistors comprise MOSFETs.

6. The apparatus of claim 1 wherein the pair of additional transistors comprise MOSFETs.

7. The apparatus of claim 1 wherein the output signal is inverted before transmission to the output.

8. The apparatus of claim 1 wherein the timing signal is inverted.

9. The apparatus of claim 1 further comprising:
a second pair of additional transistors connected in parallel with another of the transmission gate transistors.

10. A method comprising:
passing an input signal through two on-path inverters from an input to an output of a flip-flop;
controlling the timing of passing of the input signal to the output using two feedback inverters that are connected respectively in parallel with the two on-path inverters and are responsive to a timing signal, the on-path inverters not being directly responsive to the timing signal;
passing the input signal through transmission gate transistors that connect serially between the input and the first on-path inverter and between the first on-path inverter and the second on-path inverter; and
sensing the input signal at a pair of additional transistors connected in parallel with one of the transmission gate transistors.

11. The method of claim 10 further comprising controlling the timing of the passing of the input signal to the output with the timing signal on the first feedback inverter and an inverted version of the timing signal on the second feedback inverter.

12. The method of claim 10 further comprising passing the input signal through transistors to the output of the flip-flop.

13. The method of claim 10 further comprising passing the input signal through MOSFETs to the output of the flip-flop.

14. The method of claim 10 further comprising passing the input signal through transmission gate transistors that comprise MOSFETs.

15. The method of claim 10 further comprising passing the input signal though the pair of additional transistors that comprise MOSFETs.

16. The method of claim 10 further comprising inverting the output signal before transmission to the output.

17. The method of claim 10 further comprising controlling the timing by inverting the timing signal.

18. The method of claim 10 further comprising:
passing the input signal through a second pair of additional transistors connected in parallel with another of the transmission gate transistors.

19. A flip-flop comprising:
an input configured to receive an input signal;
an output configured to deliver an output signal corresponding to the input signal;
a clock terminal configured to provide a timing signal for reception of the input signal at the input and transmission of the output signal at the output;
two on-path inverters connected serially between the input and output, the two on-path inverters being configured not to respond to the timing signal;
two feedback inverters respectively connected in parallel with the two on-path inverters, the first and second feedback inverters being configured to respond to the timing signal;
transmission gate transistors connected serially between the input and the first on-path inverter and between the first on-path inverter and the second on-path inverter; and
a pair of two additional transistors connected in parallel with one of the transmission gate transistors.

20. The flip-flop of claim 19 wherein the transmission gate transistors comprise MOSFETs.

21. The flip-flop of claim 19 wherein the pair of additional transistors comprise MOSFETs.

22. The flip-flop of claim 19 further comprising:
a second pair of additional transistors connected in parallel with another of the transmission gate transistors.

23. An apparatus comprising:
a flip-flop including:
an input configured to receive an input signal and an output configured to deliver an output signal corresponding to the input signal,
two on-path inverters connected serially between the input and output,
two feedback inverters respectively connected in parallel with the two on-path inverters,
two transmission gate transistors respectively connected serially between the input and the first on-path inverter and between the first on-path inverter and the second on-path inverter, and
a pair of additional transistors connected in parallel with one of the transmission gate transistors.

24. The apparatus of claim 23 further comprising:
a second pair of additional transistors connected in parallel with another of the transmission gate transistors.

25. A method comprising:
passing an input signal through two on-path inverters from an input to an output of a flip-flop;
controlling the timing of passing of the input signal to the output using two feedback inverters that are connected respectively in parallel with the two on-path inverters;
passing the input signal through transmission gate transistors that connect serially between the input and the first on-path inverter and between the first on-path inverter and the second on-path inverter,
sensing the input signal at a pair of additional transistors connected in parallel with one of the transmission gate transistors.

26. The method of claim 25 further comprising:
passing the input signal through a second pair of additional transistors connected in parallel with another of the transmission gate transistors.

* * * * *